US007305094B2

(12) United States Patent

Kashani

(10) Patent No.: US 7,305,094 B2

(45) Date of Patent: Dec. 4, 2007

(54) SYSTEM AND METHOD FOR ACTIVELY DAMPING BOOM NOISE IN A VIBRO-ACOUSTIC ENCLOSURE

(75) Inventor: Reza Kashani, Dayton, OH (US)

(73) Assignee: University of Dayton, Dayton, OH (US)

( * ) Notice: Subject to any disclaimer, the term of this patent is extended or adjusted under 35 U.S.C. 154(b) by 920 days.

(21) Appl. No.: 10/044,045

(22) Filed: Jan. 11, 2002

(65) Prior Publication Data

US 2002/0126852 A1 Sep. 12, 2002

Related U.S. Application Data

(60) Provisional application No. 60/261,643, filed on Jan. 12, 2001.

(51) Int. Cl.
*H03B 29/00* (2006.01)

(52) U.S. Cl. ................. 381/71.4; 381/71.8; 381/71.14; 381/71.9

(58) Field of Classification Search ............... 381/71.1, 381/71.4, 71.8, 71.9, 71.14
See application file for complete search history.

(56) References Cited

U.S. PATENT DOCUMENTS

| | | | | |
|---|---|---|---|---|
| 4,689,821 | A | 8/1987 | Salikuddin et al. | |
| 4,715,559 | A * | 12/1987 | Fuller | 244/1 N |
| 4,876,722 | A | 10/1989 | Dekker et al. | |
| 5,125,241 | A | 6/1992 | Nakanishi et al. | |
| 5,310,137 | A | 5/1994 | Yoerkie, Jr. et al. | |
| 5,343,713 | A | 9/1994 | Okabe et al. | |
| 5,355,417 | A | 10/1994 | Burdisso et al. | |
| 5,373,922 | A | 12/1994 | Marra | |
| 5,394,478 | A | 2/1995 | Hathaway et al. | |
| 5,410,605 | A * | 4/1995 | Sawada et al. | 381/71.14 |
| 5,410,607 | A | 4/1995 | Mason et al. | |
| 5,515,444 | A | 5/1996 | Burdisso et al. | |
| 5,526,292 | A * | 6/1996 | Hodgson et al. | 700/280 |
| 5,558,298 | A | 9/1996 | Pla et al. | |
| 5,617,315 | A * | 4/1997 | Nakao et al. | 701/36 |
| 5,629,986 | A * | 5/1997 | Shoureshi | 381/71.12 |

(Continued)

FOREIGN PATENT DOCUMENTS

JP 06110474 A * 4/1994

OTHER PUBLICATIONS

Kashani,R. etal. Acoustic Damping of Dodge Durango Cabin. Proceedings of the Society of Automotive Engineers (SAE) Noise and Vibration Conf. Traverse City, MI, 2001, pp. 1-6.*

(Continued)

*Primary Examiner*—Vivian Chin
*Assistant Examiner*—Devona E. Faulk
(74) *Attorney, Agent, or Firm*—Dinsmore & Shohl LLP

(57) ABSTRACT

A system and method for actively damping boom noise within an enclosure such as an automobile cabin. The system comprises an acoustic wave sensor, a motion sensor, an acoustic wave actuator, a first electronic feedback loop, and a second electronic feedback loop. The enclosure defines a plurality of low-frequency acoustic modes that can be induced/excited by the enclosure cavity, by the structural vibration of a panel of the enclosure, by idle engine firings, and a combination thereof. The acoustic wave actuator is substantially collocated with the acoustic wave sensor within the enclosure. The motion sensor can be secured to a panel of the enclosure.

8 Claims, 15 Drawing Sheets

U.S. PATENT DOCUMENTS

| | | | | |
|---|---|---|---|---|
| 5,651,072 | A * | 7/1997 | Nakao et al. | 381/71.2 |
| 5,666,427 | A | 9/1997 | Kim et al. | |
| 5,748,748 | A * | 5/1998 | Fischer et al. | 381/71.4 |
| 5,784,300 | A * | 7/1998 | Neumeier et al. | 702/106 |
| 5,841,876 | A | 11/1998 | Gifford et al. | |
| 5,974,155 | A * | 10/1999 | Kashani et al. | 381/71.14 |
| 5,978,489 | A | 11/1999 | Wan | |
| 6,002,778 | A * | 12/1999 | Rossetti et al. | 381/71.4 |
| 6,018,689 | A | 1/2000 | Kumura et al. | |
| 6,031,917 | A | 2/2000 | Mathur | |
| 6,151,396 | A * | 11/2000 | Maier | 381/71.14 |
| 6,192,133 | B1 * | 2/2001 | Enamito et al. | 381/71.5 |

OTHER PUBLICATIONS

4:Inspec 1983-1997/EB WI 1997, Institution of Electrical Engineers pp. 1-13.*

NASA-RECON Database Search Report, pp. 1-10.*

Clark et al. Acitve damping of enclosed sound feilds through direct rate feedback control. J. Acoust. Soc. Am. 97(3), Mar. 1995, 1995 Acoustical Society of America, pp. 1710-1716.*

8:Ei; Compendex(R) Mar. 1979-1997 WZ, 1997, Engineering Infor. Inc., pp. 14-18.*

340:Claims(R)/US Patent ABS Nov. 1950-1996, 1997 IFI/Plenum DAta Corp., pp. 19-25.*

Freymann, R. Passive and Acitve Danmping Augmentation Systems in the Fields of Structural Dynamics and Acoustics, 30th AIAA/ASME/ASCE/AHS/ASC Structures, Structual Dynamics and Materials Conference. Apr. 3-5, 1989, pp. 348-361.*

Hong, J et al. Modeling Identification and Feedback Control of Noise in an Acoustic Duct from IEEE Transactions on Control Systems Technology, vol. 4, No. 3, May 1996, pp. 283-291.*

Kashani, R. et al., "Acoustic Damping of Dodge Durango Cabin," Proceedings of the Society of Automotive Engineers (SAE) Noise and Vibration Conf. Traverse City, MI, 2001, pp. 1-6.

"4:Inspec 1983-1997/EB WI, 1997, Institution of Electrical Engineers, pp. 1-13".

"NASA—RECON Database Search Report, pp. 1-10".

"340:Claims (R)/US Patents ABS Nov. 1950-1996, 1997 IFI/Plenum Data Corp., pp. 19-25".

"8:Ei; Compendex(R) Mar. 1970-1997 WZ, 1997, Engineering Info. Inc., pp. 14-18".

Clark et al., Active damping of enclosed sound fields through direct rate feedback control, J. Acoust. Soc. Am. 97(3), Mar. 1995, 1995 Acoustical Society of America, pp. 1710-1716.

Freymann, R., "Passive and Active Damping Augmentation Systems in the Fields of Structural Dynamics and Acoustics," 30th AIAA/ASME/ASCE/AHS/ASC Structures, Structural Dynamics and Materials Conference, Apr. 3-5, 1989, pp. 348-361.

Hong, J. et al., Article entitled "Modeling, Identification, and Feedback Control of Noise in an Acoustic Duct" from IEEE Transactions on Control Systems Technology, vol. 4, No. 3, May 1996, pp. 283-291.

* cited by examiner

SYSTEM AND METHOD FOR ACTIVELY DAMPING BOOM NOISE IN A VIBRO-ACOUSTIC ENCLOSURE

CROSS-REFERENCE TO RELATED APPLICATIONS

This application claims the benefit of U.S. Provisional Application Ser. No. 60/261,643, ACTIVE BOOM NOISE DAMPING IN A VIBRO-ACOUSTIC ENCLOSURE, filed Jan. 12, 2001.

BACKGROUND OF THE INVENTION

The present invention relates in general to a system and method for actively damping boom noise within an enclosure and, more particularly, to such a system and method which employs both a motion sensor and a collocated microphone and speaker noise control scheme within an enclosure, such as an automobile cabin.

When driven, the cabins of large automobiles, such as sport utility vehicles and minivans, exhibit a relatively high level of low-frequency "impact boom" noise, particularly when driven over rough road surfaces. The low-frequency road noise generated within an automobile cabin is a result of vibro-acoustic resonance within the cabin interior and is commonly characterized by a number of low-frequency resonant modes. This can detrimentally affect occupant comfort and well being, as well as the quality of voice and music within the enclosure. The structural dynamics of the panels which form the cabin, and the acoustic dynamics of the enclosure therein, make up the elements of this vibro-acoustic system.

Known in the relevant art is the use of passive noise control materials in the interiors of large automobiles. While plush interiors, thick carpets, and other sound absorbing materials are effective in abating higher frequency sound, they become increasingly less effective at lower frequencies and totally ineffective at bass frequencies. Frequently, the overuse of such treatments results in a "dead" sounding cabin with a loss of the natural clarity and sparkle of voice and music. Consequently, an active noise control system is required.

The general principals of active noise control are well established and basically consist of detecting the noise to be controlled, and replaying the detected noise in antiphase via a loudspeaker so that the regenerated noise destructively interferes with the source noise. While several conventional techniques have been found to effectively absorb the energy of offending, low-frequency modes which cause boominess within an enclosure, none are without significant shortcomings. The objectionably large size of conventional low-frequency absorbers, such as Helmholtz resonators (HR), as well as their inability to be tuned to multiple frequencies, and thus requiring a bank of HRs to be installed, make the use of such conventional absorbers in automobile cabins and other relatively small enclosures highly impractical. Other known active noise control systems control noise in only limited local areas within a three-dimensional space.

U.S. Pat. No. 5,974,155 teaches a system and method for actively dampening low-frequency noise within an enclosure wherein an electronic feedback loop is employed to drive an acoustic dampening source within an enclosure. The system further employs an acoustic wave sensor or microphone for detecting the low-frequency noise to be dampened. However, in addition to the acoustic resonance generated by low-frequency road noise, a vehicle can also exhibit adjacent vibro-acoustic resonance originating from the structural vibration of the panels which form the vehicle cabin. The active acoustic dampening system of the '155 patent was designed to abate cabin originated resonance. Consequently, the need remains in the relevant art for an active acoustic dampening system which effectively dampens acoustic resonance originating from both the cabin, as well as the vibro-acoustic resonance caused by panel vibration in an automobile.

While further known is the use of detection means which record the rotational velocity of a motor, as well as those which employ an accelerometer or motion sensor, the art is devoid of a system which employs the combination of a collocated microphone and speaker arrangement with that of a motion sensor-based, low-frequency noise control scheme within an enclosure.

Accordingly, the need remains in the present art for a system and method that effectively reduces low-frequency noise within an enclosure, in particular, the enclosure of an automobile where the noise generated within the cabin is characterized by a number of low-frequency vibro-acoustic modes of significant magnitude.

SUMMARY OF THE INVENTION

The present invention meets this need by providing a system and method for actively damping boom noise within an enclosure defining a plurality of low-frequency acoustic modes. More specifically, the system is effective in damping cavity induced low-frequency acoustic modes, structural vibration induced low-frequency acoustic modes, low-frequency acoustic modes excited by engine firings, and combinations thereof by way of an active feedback control scheme.

In accordance with one embodiment of the present invention, a system for actively damping boom noise is provided comprising an enclosure, an acoustic wave sensor, a motion sensor, an acoustic wave actuator, and a first and second electronic feedback loop. The enclosure defines a plurality of low-frequency acoustic modes. The motion sensor, which can comprise an accelerometer, can be secured to a panel of the enclosure and can be configured to produce a motion sensor signal representative of at least one of the plurality of low-frequency acoustic modes. The motion sensor signal can comprise an electric signal indicative of measured acceleration detected by the motion sensor as a result of structural vibration of the panel and can be representative of a single or a plurality of structural vibration induced low-frequency acoustic modes.

The enclosure can further define a middle roof panel and a rear roof panel. A middle panel motion sensor can be secured to the middle roof panel and a rear panel motion sensor can be secured to the rear roof panel. Both the middle panel and rear panel motion sensors can comprise an accelerometer. The middle panel motion sensor can be configured to produce a middle panel motion sensor signal representative of at least one of the plurality of low-frequency acoustic modes and the rear panel motion sensor can be configured to produce a rear panel motion sensor signal representative of at least one of the plurality of low-frequency acoustic modes. The middle panel motion sensor signal can comprise an electric signal indicative of measured acceleration detected by the middle panel motion sensor as a result of structural vibration of the middle roof panel. In addition, the rear panel motion sensor signal can comprise an electric signal indicative of measured acceleration detected by the rear panel motion sensor as a result of structural vibration of the rear roof panel. The middle and rear panel motion sensor signals can be representative of a single roof structural vibration induced low-frequency acoustic mode, and can be representative of the same roof structural vibration induced low-frequency acoustic mode or different roof structural vibration induced low-frequency acoustic modes. Moreover, the middle and rear panel motion sensor signals can be representative of a plurality of roof structural vibration induced low-frequency acoustic modes.

The acoustic wave sensor can be positioned within the enclosure and can comprise a microphone. The acoustic wave sensor can be configured to produce an acoustic wave sensor signal representative of at least one of the plurality of low-frequency acoustic modes and can comprise an electric signal indicative of measured acoustic resonance detected by the acoustic wave sensor within the enclosure. The acoustic wave sensor signal can be representative of a single cavity induced low-frequency acoustic mode or a plurality of cavity induced low-frequency acoustic modes.

The first electronic feedback loop can define an acoustic damping controller. The acoustic damping controller can define a first electronic feedback loop input coupled to an acoustic wave sensor signal and a first electronic feedback loop output, wherein the first electronic feedback loop is configured to generate a first electronic feedback loop output signal by applying a feedback loop transfer function to the acoustic wave sensor signal. The second electronic feedback loop can define a vibro-acoustic controller. The vibro-acoustic controller can define a second electronic feedback loop input coupled to a motion sensor signal and a second electronic feedback loop output, wherein the second electronic feedback loop is configured to generate a second electronic feedback loop output signal by applying a feedback loop transfer function to the motion sensor signal.

The second electronic feedback loop can further define a middle panel vibro-acoustic controller in parallel with a rear panel vibro-acoustic controller. The middle panel vibro-acoustic controller can define a middle panel vibro-acoustic controller input coupled to a middle panel motion sensor signal and a middle panel vibro-acoustic controller output, wherein the middle panel vibro-acoustic controller is configured to generate a middle panel vibro-acoustic controller output signal by applying a feedback loop transfer function to the middle panel motion sensor signal. The rear panel vibro-acoustic controller can define a rear panel vibro-acoustic controller input coupled to a rear panel motion sensor signal and a rear panel vibro-acoustic controller output, wherein the rear panel vibro-acoustic controller is configured to generate a rear panel vibro-acoustic controller output signal by applying an electronic feedback loop transfer function to the rear panel motion sensor signal. The middle and rear panel vibro-acoustic controller output signals can be combined to generate a second electronic feedback loop output signal.

The acoustic wave actuator is substantially collocated with the acoustic wave sensor and can be positioned within the enclosure. The acoustic wave actuator can be responsive to a first and second electronic feedback loop output signal. The acoustic wave actuator substantially collocated with the acoustic wave sensor can be positioned to correspond to the location of the acoustic anti-node of a target acoustic mode within the enclosure and can introduce characteristic acoustic dynamics into the system. The first and second electronic feedback loops can be configured to introduce inverse acoustic dynamics into the system and the first and second electronic feedback loop output signals can be representative of a rate of change of volume velocity to be produced by the acoustic wave actuator.

In accordance with another embodiment of the present invention, the system for actively damping boom noise can further comprise a feedback loop transfer function which comprises a second order differential equation including a first variable representing a predetermined damping ratio and a second variable representing a tuned natural frequency selected to be tuned to a natural frequency of at least one of the plurality of low-frequency acoustic modes. Further, the feedback loop transfer function defines a frequency response having a characteristic maximum gain substantially corresponding to the value of the tuned natural frequency. Finally, the feedback loop transfer function creates a 90 degree phase lead substantially at the tuned natural frequency.

In accordance with another embodiment of the present invention, a method for actively damping boom noise within an enclosure defining a plurality of low-frequency acoustic modes is provided comprising the steps of: securing a motion sensor to a panel of the enclosure, wherein the motion sensor is configured to produce a motion sensor signal representative of at least one of the plurality of low-frequency acoustic modes; positioning an acoustic wave sensor within the enclosure, wherein the acoustic wave sensor is configured to produce an acoustic wave sensor signal representative of at least one of the plurality of low-frequency acoustic modes; positioning an acoustic wave actuator responsive to a first electronic feedback loop output signal and a second electronic feedback loop output signal within the enclosure, wherein the acoustic wave actuator is substantially collocated with the acoustic wave sensor; coupling a first electronic feedback loop input of a first electronic feedback loop to the acoustic wave sensor signal and a first electronic feedback loop output, wherein the first electronic feedback loop is configured to generate the first electronic feedback loop output signal by applying a feedback loop transfer function to the acoustic wave sensor signal; coupling a second electronic feedback loop input of a second electronic feedback loop to the motion sensor signal and a second electronic feedback loop output, wherein the second electronic feedback loop is configured to generate the second electronic feedback loop output signal by applying a feedback loop transfer function to the motion sensor signal; and operating the acoustic wave actuator in response to the first and second electronic feedback loop output signals.

The feedback loop transfer function comprises a second order differential equation including a first variable representing a predetermined damping ratio and a second variable representing a tuned natural frequency selected to be tuned to a natural frequency of at least one of the plurality of low-frequency acoustic modes. Further, the feedback loop transfer function defines a frequency response having a characteristic maximum gain substantially corresponding to the value of the tuned natural frequency. Finally, the feedback loop transfer function creates a 90 degree phase lead substantially at the tuned natural frequency.

In accordance with another embodiment of the present invention, a system for actively damping boom noise is provided comprising an enclosure defining at least one tailgate vibration induced low-frequency acoustic mode, a first cavity induced low-frequency acoustic mode, and a roof structural vibration induced low-frequency acoustic mode. The resonant frequency of the at least one tailgate vibration induced low-frequency acoustic mode is substantially different than the resonant frequencies of the first cavity induced low-frequency acoustic mode or the roof structural vibration induced low-frequency acoustic mode.

In accordance with yet another embodiment of the present invention, a system for actively damping boom noise is provided comprising an enclosure, a sensor, an acoustic wave actuator, and an electronic feedback loop. The enclosure defines a tailgate panel and at least one tailgate vibration induced low-frequency acoustic mode. The sensor can be selected from an acoustic wave sensor, a motion sensor, and a combination thereof. The motion sensor can be secured to the tailgate panel and can comprise an accelerometer. If the sensor is the acoustic wave sensor, the acoustic wave actuator is substantially collocated with the acoustic wave sensor. The acoustic wave sensor can be positioned within the enclosure and can comprise a microphone. The electronic feedback loop can be selected from a first electronic feedback loop defining an acoustic damping controller, a second electronic feedback loop defining a vibro-acoustic controller, and a combination thereof.

The motion sensor can be configured to produce a tailgate motion sensor signal representative of the at least one tailgate vibration induced low-frequency acoustic mode and can comprise an electric signal indicative of measured acceleration detected by the motion sensor as a result of structural vibration of the tailgate panel. The tailgate motion sensor signal can be representative of a single or a plurality of tailgate vibration induced low-frequency acoustic modes. The acoustic wave sensor can be configured to produce an acoustic wave sensor signal representative of the at least one tailgate vibration induced low-frequency acoustic mode and can comprise an electric signal indicative of measured acoustic resonance detected by the acoustic wave sensor within the enclosure. The acoustic wave sensor signal can be representative of a single or a plurality of tailgate vibration induced low-frequency acoustic modes.

The acoustic damping controller can define a first electronic feedback loop input coupled to an acoustic wave sensor signal and a first electronic feedback loop output, wherein the first electronic feedback loop is configured to generate a first electronic feedback loop output signal by applying a feedback loop transfer function to the acoustic wave sensor signal. The vibro-acoustic controller can define a second electronic feedback loop input coupled to a motion sensor signal and a second electronic feedback loop output, wherein the second electronic feedback loop is configured to generate a second electronic feedback loop output signal by applying a feedback loop transfer function to the motion sensor signal.

In accordance with yet another embodiment of the present invention, a system for actively damping boom noise is provided comprising an enclosure defining a plurality of low-frequency acoustic modes, wherein the low-frequency acoustic modes are excited by idle engine firings; an acoustic wave sensor; a motion sensor secured to a panel of the enclosure; an acoustic wave actuator substantially collocated with the acoustic wave sensor; a first electronic feedback loop defining an acoustic damping controller; and a second electronic feedback loop defining a vibro-acoustic controller. The enclosure of this embodiment of the present invention can comprise a cabin of an automobile.

Accordingly, it is an object of the present invention to provide a system and method that effectively reduces boom noise within an enclosure where the noise generated within the enclosure is characterized by a plurality of low-frequency acoustic modes. This and other objects of the present invention will become apparent from the following description of the invention and claims.

BRIEF DESCRIPTION OF THE DRAWINGS

FIG. 7(*b*) is a plot of the acoustic frequency response function of an uncontrolled (dashed line) and controlled (solid line) rectangular enclosure at 20-110 Hz according to the present invention.

FIG. 12(*b*) is a plot of the frequency response functions mapping the voltage driving the piezo shaker to the scaled pressure measured at the middle seats of a sport utility vehicle for the controlled and uncontrolled system according to the present invention.

FIG. 12(*c*) is a plot of the frequency response functions mapping the voltage driving the piezo shaker to the scaled pressure measured at the front seats of a sport utility vehicle for the controlled and uncontrolled system according to the present invention.

DETAILED DESCRIPTION OF THE INVENTION

Figure 1:
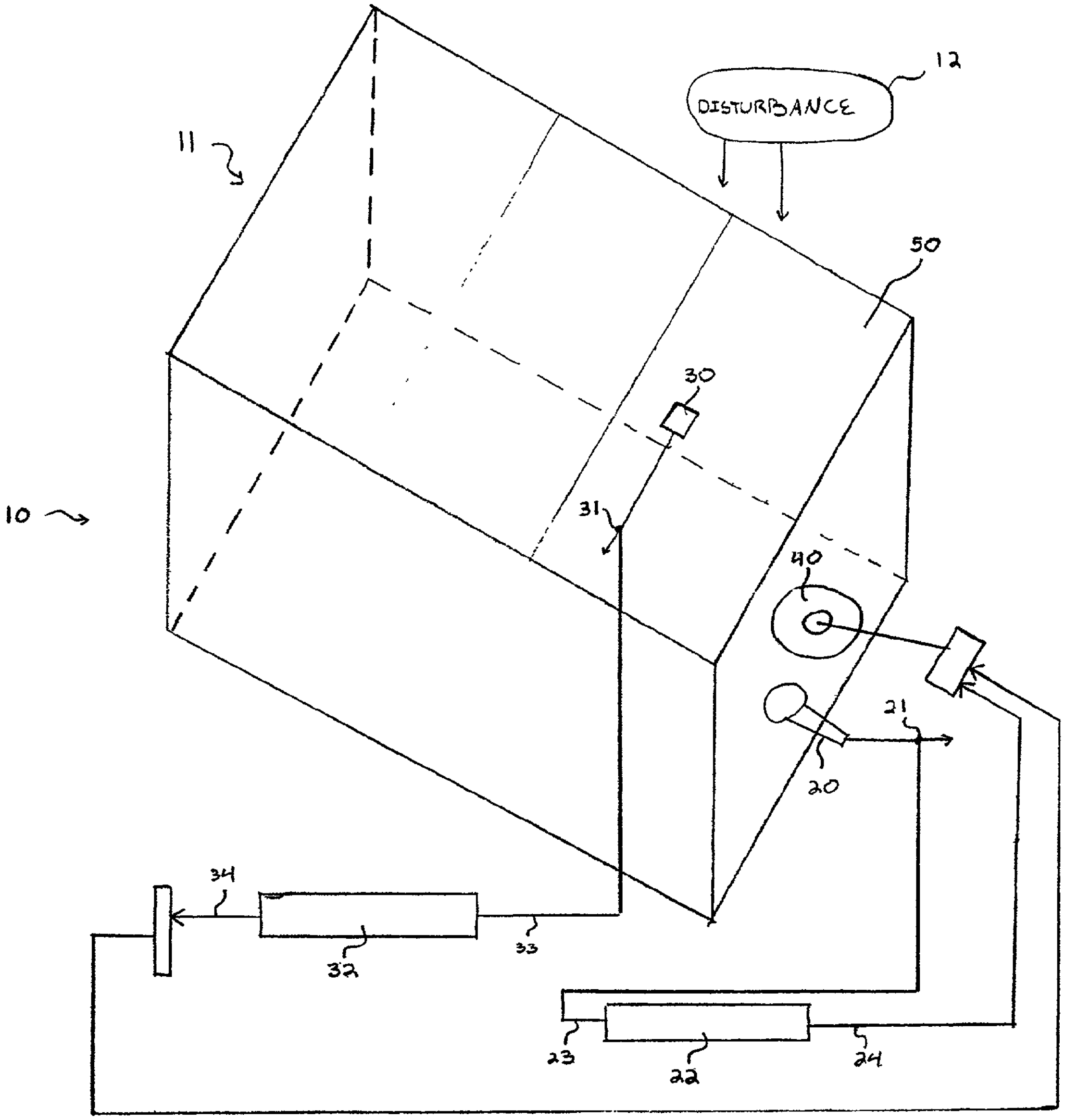
FIG. 1 is a general schematic illustration of a system for actively damping boom noise according to the present invention.

Referring initially to FIG. 1, a system for actively damping boom noise 10 according to the present invention is illustrated in general schematic form. The system 10 employs two separate feedback control schemes for reducing the boominess of sound at frequencies corresponding to a plurality of low-frequency acoustic modes. The system 10 comprises an enclosure 11, an acoustic wave sensor 20, a motion sensor 30, an acoustic wave actuator 40, a first electronic feedback loop, and a second electronic feedback loop. As will be appreciated by those skilled in the art of acoustics, the enclosure 11, which can be a cabin of an automobile, defines a plurality of low-frequency acoustic modes. The plurality of low-frequency acoustic modes can be induced/excited by the enclosure cavity, by the structural vibration of a panel of the enclosure, by idle engine firings, or a combination thereof.

An enclosed space produces a complex set of standing waves, whose natural frequencies are determined by the dimensions of that space. The determination of these standing wave frequencies and shapes, and the proper measures to eliminate them, involves mathematical modeling of the enclosure. Wave propagation is commonly used to study and design the low-frequency acoustics of generally rectangular enclosures, such as cabins of large automobiles (minivans and sport utility vehicles). This method is based upon the motion of waves within a three-dimensional bounded space.

Figure 2A:
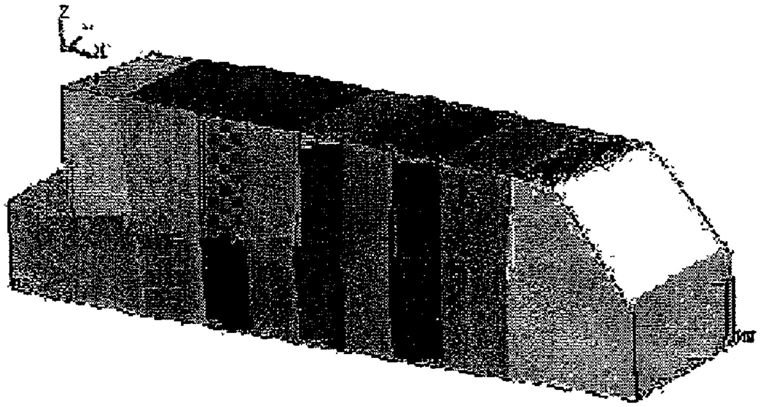
FIGS. 2(*a*) and 2(*b*) illustrate different acoustic mode shapes of an enclosure.
Figure 2B:
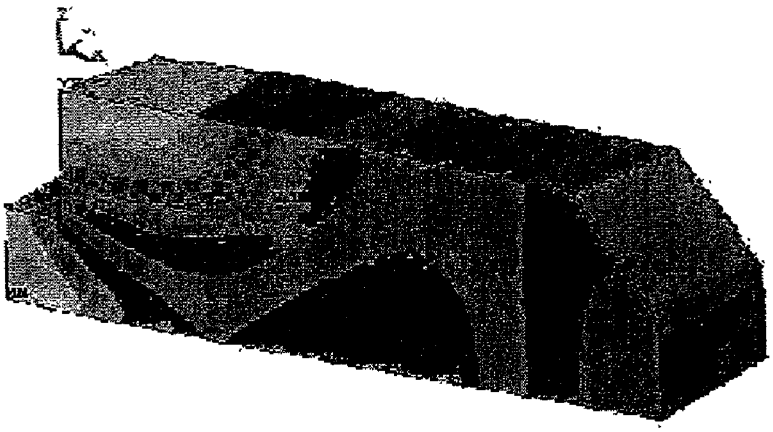

For more complex geometries, finite element analysis can be used to model the acoustics of an enclosure and identify resonant frequencies and mode shapes. FIGS. 2(*a*) and 2(*b*) illustrate two acoustic mode shapes of the cabin of a large automobile. Due to the symmetry of the cabin, only half of the cavity (along its width) is modeled for efficient computations.

The resonant frequencies and the corresponding mode shapes of the standing waves in a closed space depend primarily on the shape and size of the space, whereas their damping depend mainly on the boundary conditions, i.e., either acoustic impedance or the absorption at the walls. Stiff walls keep more energy in the enclosure and make the distribution of energy in the modal range much less even, with the modal peaks more distinct.

Figure 3:
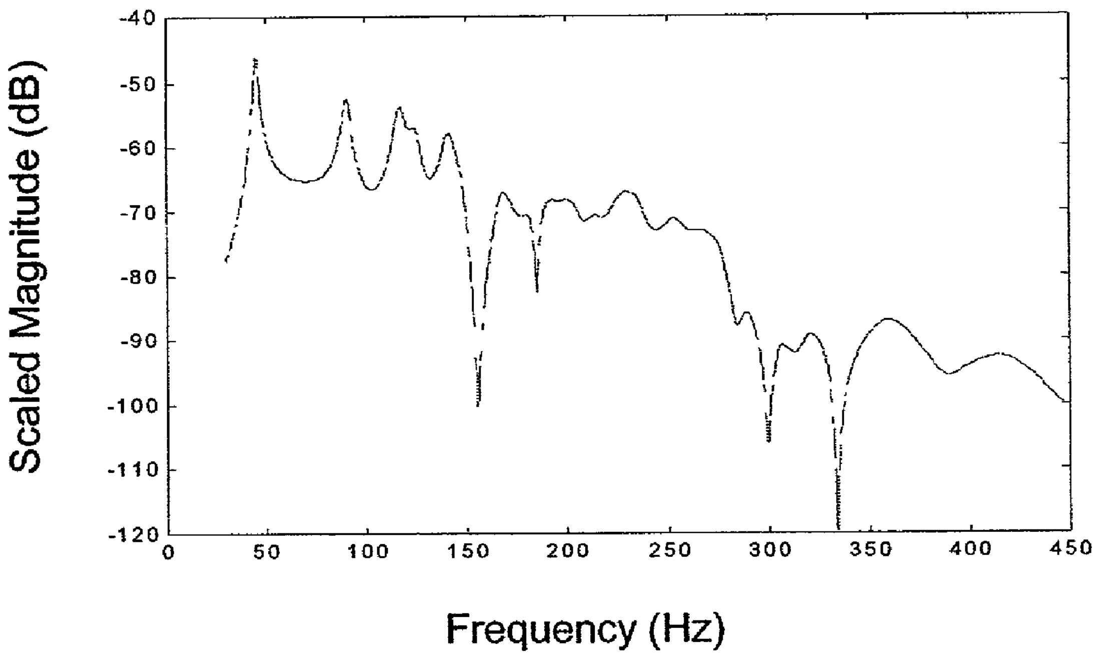
FIG. 3 is a plot of the acoustic frequency response of a rectangular space.

For purposes of further defining and describing the present invention, the transmission of sound from a point volume velocity source located at one corner of a 3.8×1.5×1.2 m rectangular closed space (approximately the size of a mid-size sport utility vehicle) to an acoustic wave sensor such as a microphone located in a diagonally opposite corner over the frequency range of 20-450 Hz is depicted in FIG. 3. This Figure illustrates the marked influence an enclosure has on sound transmission, especially at very low frequencies. Consequently, most of the bass acoustic energy is in the first mode (or first few modes). This is the reason for the flabby, boomy, "one-tone" character of low-frequency sound in a large vehicle.

Table 1 below shows the resonant frequencies under 215 Hz for the 3.8×1.5×1.2 m rectangular space. The corresponding modes are either numbered consecutively in the order of increase in resonant frequency or indexed using three integers indicating the number of cycles of the standing waves formed in length, width, and height directions (x, y, and z) of the enclosure. For example, mode #4, corresponding to the resonance frequency of 124 Hz, has the mode index of 1, 1, 0 indicating one standing wave along x, one along y, and none along z directions.

TABLE 1

Natural Frequencies Under 215 Hz for a 3.8 × 1.5 × 1.2 m Rectangular Space

| Mode | Nx, Ny, Nz | F, Hz |
|---|---|---|
| 1 | 1,0,0 | 45.13 |
| 2 | 2,0,0 | 90.26 |
| 3 | 0,1,0 | 116.41 |
| 4 | 1,1,0 | 124.85 |
| 5 | 3,0,0 | 135.39 |
| 6 | 0,0,1 | 140.66 |
| 7 | 2,1,0 | 147.30 |
| 8 | 1,0,1 | 147.72 |
| 9 | 2,0,1 | 167.13 |
| 10 | 3,1,0 | 178.56 |
| 11 | 4,0,0 | 180.52 |
| 12 | 0,1,1 | 182.58 |
| 13 | 1,1,1 | 188.08 |
| 14 | 3,0,1 | 195.24 |
| 15 | 2,1,1 | 203.68 |
| 16 | 4,1,1 | 214.80 |

Figure 4A:
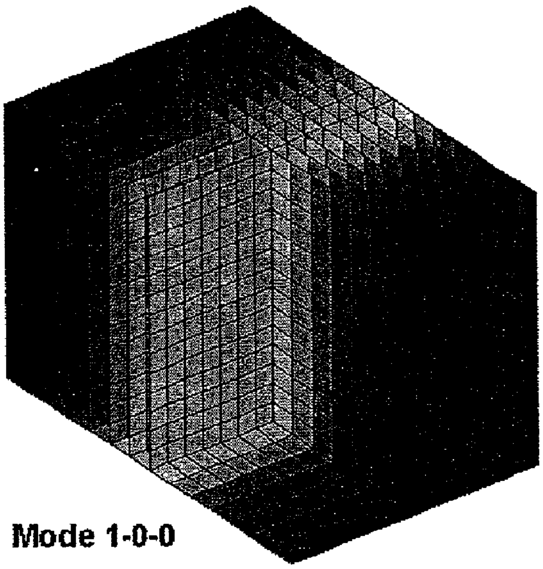
FIGS. 4(*a*) and 4(*b*) illustrate different acoustic modes of a rectangular space. Lowest (negative) and highest (positive) pressures are signified by medium and dark shades, respectively.
Figure 4B:
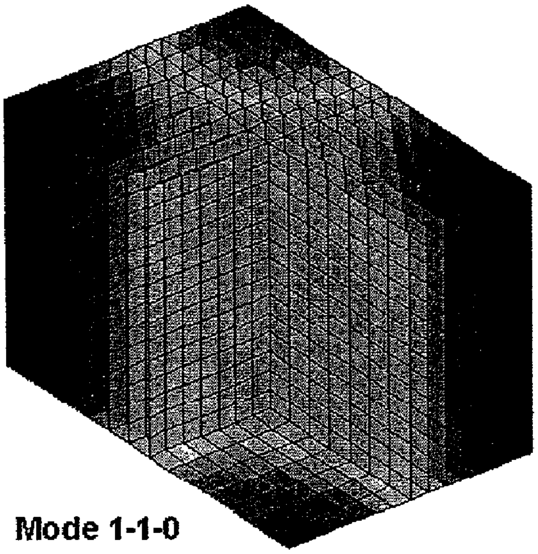

FIG. 3 illustrates the modal patterns for two of the standing waves of the 3.8×1.5×1.2 m space. Each mode shape clearly indicates how tones at their corresponding frequencies will be heard in the enclosure. Mode #1 (indexed 1, 0, 0) that carries most of the low-frequency acoustic energy is a one dimensional, 45 Hz (see Table 1 above) standing wave formed along the length of the space. Any sound at 45 Hz or its close vicinity will be heard the loudest close to the front and rear ends of the space and the lowest at the middle along the length (see FIG. 4(*a*)). This is why in a sport utility vehicle with three rows of seats, the boom noise is felt more by the front and rear row seat passengers than it is by the middle row seat passengers.

Standing waves occur at high frequencies too. However, due to the short wavelength of sound at higher frequencies, the modal density (the number of modes in a frequency interval) at these frequencies is by far higher than that at low frequencies. For example, there are as many modes in the 20-165 Hz frequency range of Table 1 above as the number of modes in the 165-215 Hz range. Higher modal density along with the high absorption effectiveness of the plush interior and other absorptive material within the enclosed space make the variation in sound intensity at different frequencies less noticeable at higher frequencies; see FIG. 3. Nevertheless, plush interior and sound absorptive materials do not solve the problem of unwanted low-frequency boom noise within an enclosure. Low-frequency absorbers, such as Helmholtz resonators (HRs), can be used as an effective solution for this problem. These resonators can be designed to effectively absorb the energy of offending, low-frequency modes that cause boominess.

The frequency that a HR is tuned to is inversely proportional to the square root of the cavity volume of the resonator. This makes the size of HRs objectionably large when tuned to low frequencies. Another potential concern about using a HR is that when used for adding damping to an acoustic mode, a fair amount of energy dissipation should occur in the HR. There might not be enough friction to the flow of fluid in the neck of a typical HR for it to be used effectively in such capacity. Lastly, a HR can only be tuned to a single frequency. When absorption at multiple frequencies is required, a bank of HRs should be used, further exacerbating the size problem.

Thus, in accordance with the present invention, the acoustic wave sensor 20, which can be positioned within the enclosure 11, is configured to produce an acoustic wave sensor signal 21 representative of at least one of the plurality of low-frequency acoustic modes (see FIG. 1). Specifically, the acoustic wave sensor 20 can be a microphone which produces an electric signal indicative of measured acoustic resonance detected by the acoustic wave sensor 20 within the enclosure 11. More specifically, the acoustic wave sensor signal 21 can be representative of a single cavity induced low-frequency acoustic mode or a plurality of cavity induced low-frequency acoustic modes.

The acoustic wave actuator 40 can also be positioned within the enclosure 11 and is substantially collocated with the acoustic wave sensor 20 to optimize noise damping according to the present invention. For purposes of defining and describing the present invention, it should be understood that a substantially collocated arrangement includes any arrangement where the acoustic wave actuator 40 and the acoustic wave sensor 20 are positioned close enough to each other to ensure that the phase angles of the wave propagating through the enclosure 11 in the vicinity of the acoustic wave actuator 40 and the acoustic wave sensor 20 are the same at low frequencies. For example, the acoustic wave actuator 40 and the acoustic wave sensor 20 are substantially collocated relative to each other when they are positioned directly adjacent to each other, as illustrated in FIG. 1. The general position of the collocated acoustic wave sensor 20 and acoustic wave actuator 40 within the enclosure 11 may be as indicated in FIG. 1, but is typically selected to correspond to the location of an acoustic anti-node of a target acoustic mode within the enclosure 11. The location of the anti-node may be determined by measuring pressure at a target frequency at various locations within the enclosure 11 or through construction of an acoustic model of the enclosure 11.

Also illustrated in FIG. 1, the motion sensor 30 is secured to a panel 50 of the enclosure 11 and is configured to produce a motion sensor signal 31 representative of at least one of the plurality of low-frequency acoustic modes. The panel 50 can be any of an infinite number of panels which form the enclosure 11, including, but not limited to, roof panels, side panels, tailgate panels, floor panels, etc. The motion sensor 30 can be an accelerometer which produces an electric signal indicative of measured acceleration detected by the motion sensor 30 as a result of structural vibration of the panel 50. Low-cost MEMS accelerometers similar to the ones used in air bag systems can be used as sensors. More specifically, the motion sensor signal 31 can be representative of a single structural vibration induced low-frequency acoustic mode or a plurality of structural vibration induced low-frequency acoustic modes.

Figure 5:
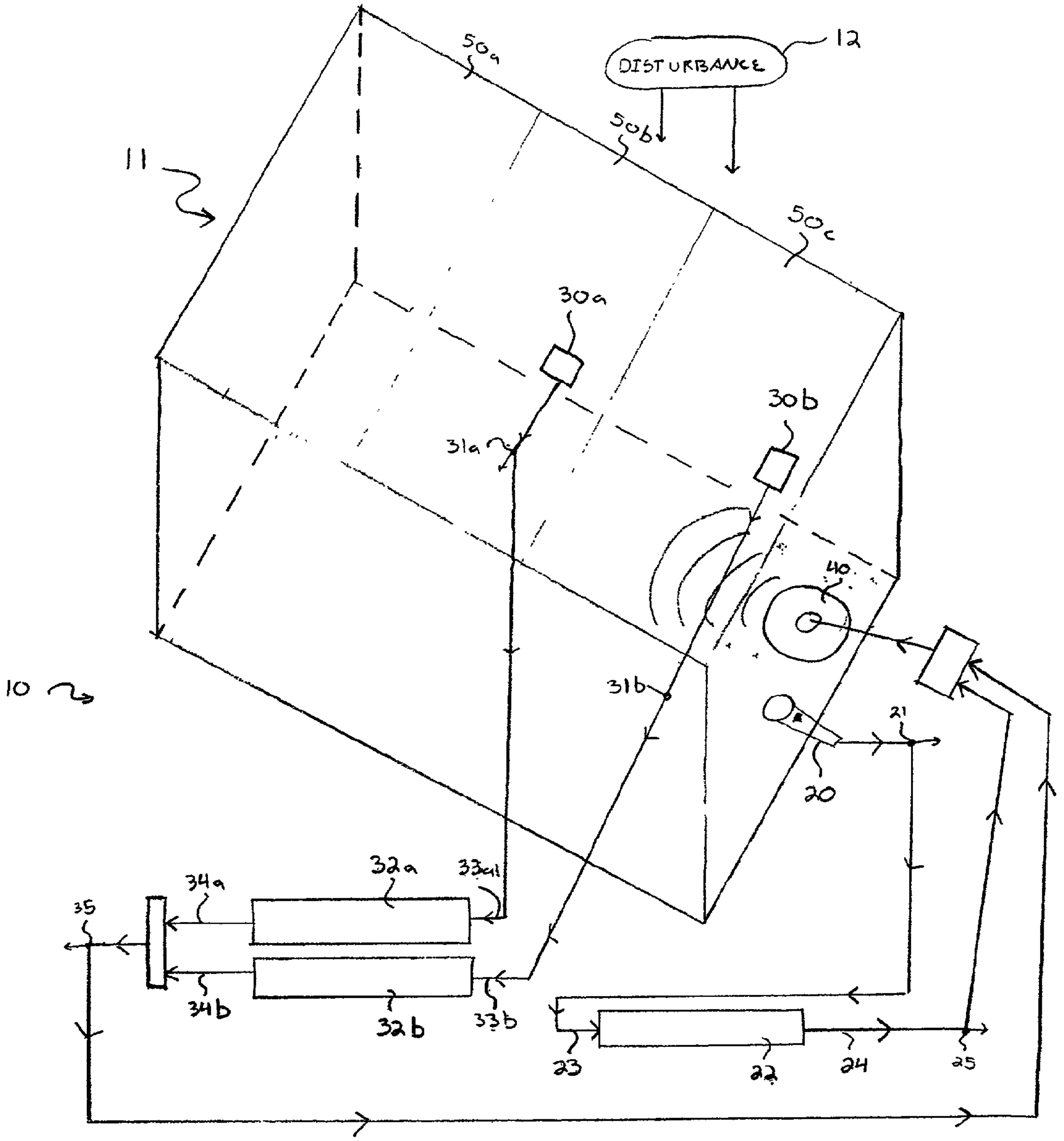
FIG. 5 is a schematic illustration of a system for actively damping boom noise according to another embodiment of the present invention.

Referring now to FIG. 5, the enclosure 11 can further define a front roof panel 50*a*, a middle roof panel 50*b*, and a rear roof panel 50*c*. Typically, a middle panel motion sensor 30*a* is secured to the middle roof panel 50*b* and a rear panel motion sensor 30*b* is secured to the rear roof panel 50*c*. While FIG. 5 shows three roof panels and two motion sensors, the enclosure 11 may have one or an infinite number of roof panels, as well as one or an infinite number of motion sensors secured thereto. The middle panel motion sensor 30*a* is configured to produce a middle panel motion sensor signal 31*a* representative of at least one of the plurality of low-frequency acoustic modes. Further, the rear panel motion sensor 30*b* is configured to produce a rear panel motion sensor signal 31*b* representative of at least one of the plurality of low-frequency acoustic modes. Specifically, the middle panel motion sensor 30*a* and the rear panel motion sensor 30*b* can both be accelerometers which produce electric signals indicative of measured acceleration detected by the middle and rear panel motion sensors 30*a*, 30*b* as a result of structural vibration of the middle roof panel 50*b* and the rear roof panel 50*c*, respectively. More specifically, the middle panel motion sensor signal 31*a* and the rear panel motion sensor signal 31*b* can each be representative of a single roof structural vibration induced low-frequency acoustic mode, which can be representative of the same roof structural vibration induced low-frequency acoustic mode, or different. Further, the middle panel motion sensor signal 31*a* and the rear panel motion sensor signal 31*b* can be representative of a plurality of roof structural vibration induced low-frequency acoustic modes, which can be the same or different.

Referring now to FIGS. 1 and 5, the first electronic feedback loop defines an acoustic damping controller 22. The acoustic damping controller 22 can define a first electronic feedback loop input 23 coupled to the acoustic wave sensor signal 21 and a first electronic feedback loop output 24. The first electronic feedback loop can be configured to generate a first electronic feedback loop output signal by applying a feedback loop transfer function to the acoustic wave sensor signal 21. The acoustic damping controller 22 should be tuned such that its natural frequency matches the resonant frequency of the cavity targeted for damping.

The feedback loop transfer function according to the present invention comprises a second order differential equation including a first variable $\zeta$ representing a predetermined damping ratio and a second variable representing a tuned natural frequency $\omega_n$. Two specific examples of transfer functions according to the present invention are presented in detail below with reference to equations (1) and (2). The acoustic damping controller 22 can be programmed to apply the feedback loop transfer function, and the other functions associated with the first electronic feedback loop described herein. Alternatively, the first electronic feedback loop may comprise conventional solid-state electronic devices configured to apply the functions associated with the first electronic feedback loop.

The first variable $\zeta$ and the second variable $\omega_n$ are selected to damp at least one of the plurality of low-frequency acoustic modes. Specifically, the first variable $\zeta$ representing the predetermined damping ratio is a value between about 0.1 and about 0.5 or, more typically, a value between about 0.3 and about 0.4. The second variable $\omega_n$ representing the tuned natural frequency is selected to be substantially equivalent to a natural frequency of a target acoustic mode of the plurality of low-frequency acoustic modes. Typically, the target acoustic mode comprises the lowest frequency mode of the plurality of low-frequency acoustic modes. It is contemplated by the present invention that, the second variable $\omega_n$ representing the tuned natural frequency may be selected to be offset from the target acoustic mode so to be positioned between the characteristic frequencies of two adjacent modes. In this manner, the magnitude of a plurality of adjacent acoustic modes may be damped.

The feedback loop transfer function can be as follows:

$$\frac{V(s)}{P(s)} = C\frac{s^2}{s^2 + 2\zeta\omega_n s + \omega_n^2} \qquad (1)$$

where the units of V(s) corresponds to the rate of change of volume velocity, P(s) corresponds to the pressure at the location of the acoustic wave actuator 40 and the acoustic wave sensor 20, s is the Laplace variable, $\zeta$ is a damping ratio, $\omega_n$ is the tuned natural frequency, and C is a constant representing a power amplification factor and a gain value. The feedback loop transfer function of equation (1) is derived from a model of a Helmholtz resonator attached to the enclosure 11 and maps the pressure in the enclosure 11 where the acoustic wave actuator 40 and the acoustic wave sensor 20 are collocated to the rate of change of volume velocity generated by the acoustic wave actuator 40.

Alternatively, the feedback loop transfer function can be as follows:

$$\frac{V(s)}{P(s)} = -C\frac{\omega_n^2}{s^2 + 2\zeta\omega_n s + \omega_n^2} \tag{2}$$

where the units of V(s) corresponds to the rate of change of volume velocity, P(s) corresponds to the pressure at the location of the acoustic wave actuator 40 and the acoustic wave sensor 20, s is the Laplace variable, $\zeta$ is a damping ratio, $\omega_n$ is the tuned natural frequency, and C is a constant representing the power amplification factor and the gain value. The feedback loop transfer function of equation (2) is derived from the positive position feedback active damping mechanism utilized for structural damping. It is noted that the power amplification factor and the gain value are dependent upon the particular specifications of the enclosure geometry, the acoustic wave sensor 20 and the acoustic wave actuator 40, and upon the amplitude of the noise created by the acoustic disturbance 12, and are subject to selection and optimization by those practicing the present invention.

The feedback loop transfer function can define a frequency response having a characteristic maximum gain $G_{MAX}$ substantially corresponding to the value of the tuned natural frequency $\omega_n$. The gain increases substantially uniformly from a minimum frequency value to an intermediate frequency value to define the characteristic maximum gain $G_{MAX}$ and decreases from the maximum gain $G_{MAX}$ substantially uniformly from the intermediate frequency value to a maximum frequency value. For the purposes of describing and defining the present invention it is noted that a substantially uniform increase comprises an increase that is not interrupted by any temporary decreases. Similarly, a substantially uniform decrease comprises a decrease that is not interrupted by any temporary increases. A substantially uniform increase or decrease may be characterized by changes in the rate of increase or decrease.

To further optimize low-frequency noise damping according to the present invention, the feedback loop transfer function can create +90° phase shifts substantially at the tuned natural frequency $\omega_n$. This 90° phase lead counters a 90° phase lag of the enclosure 11 at a frequency corresponding to the tuned natural frequency $\omega_n$.

Figure 6:
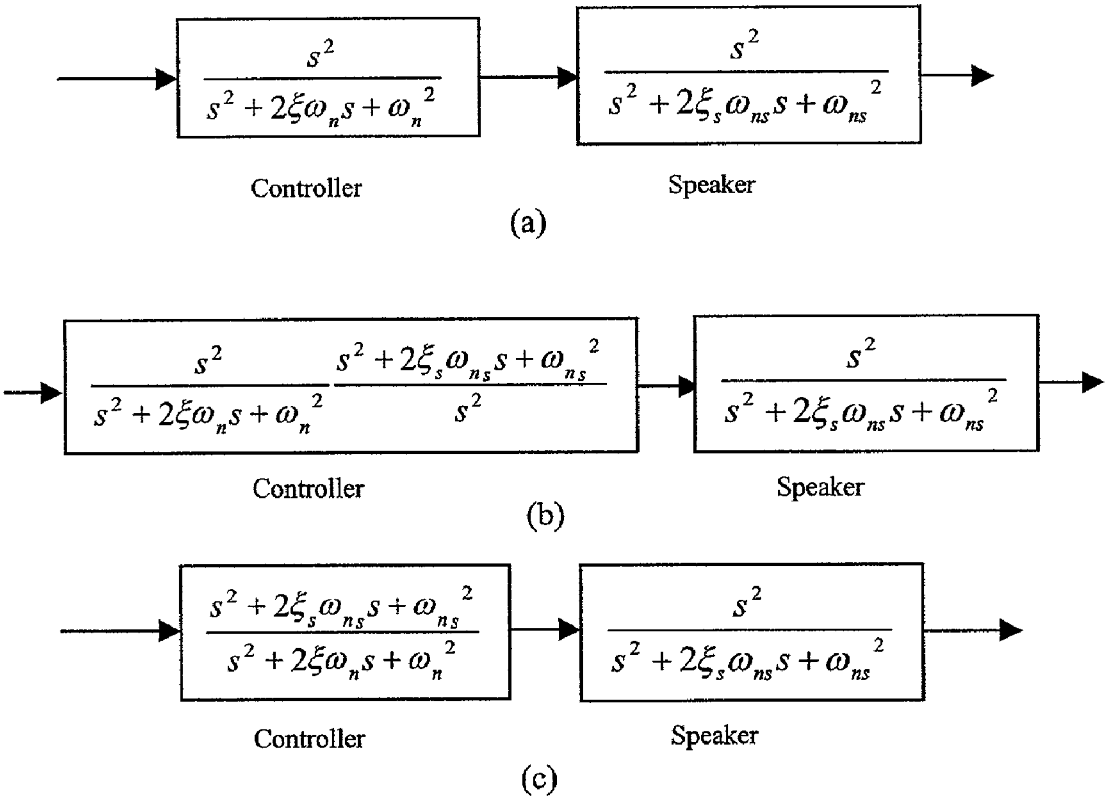
FIG. 6 is a block diagram of the different controller and acoustic wave actuator (speaker) arrangements of the present invention.

An inverse speaker model can be utilized in the first electronic feedback loop to compensate for the acoustic dynamics introduced into the system by the acoustic wave actuator 40. As part of this compensation, the inverse speaker model can be configured to introduce a phase that is equal to, but opposite in sign, with respect to the phase introduced by the acoustic wave actuator 40. The feedback loop transfer function for this compensated acoustic damping controller can be as follows:

$$\frac{V(s)}{P(s)} = C\frac{s^2 + 2\zeta_s\omega_{ns}s + \omega_{ns}^2}{s^2 + 2\zeta\omega_n s + \omega_n^2} \tag{3}$$

where the units of V(s) corresponds to the rate of change of volume velocity, P(s) corresponds to the pressure at the location of the acoustic wave actuator 40 and the acoustic wave sensor 20, s is the Laplace variable, $\zeta$ and $\zeta_s$ are damping ratios, $\omega_n$ and $\omega_{ns}$ are tuned natural frequencies, and C is a constant representing a power amplification factor and a gain value. A block diagram of the acoustic damping controller 22 and the acoustic wave actuator 40 is shown in FIG. 6(*a*). Block diagrams of the compensated acoustic damping controller and acoustic wave actuator are shown in FIGS. 6(*b*) and 6(*c*).

Figure 7A:
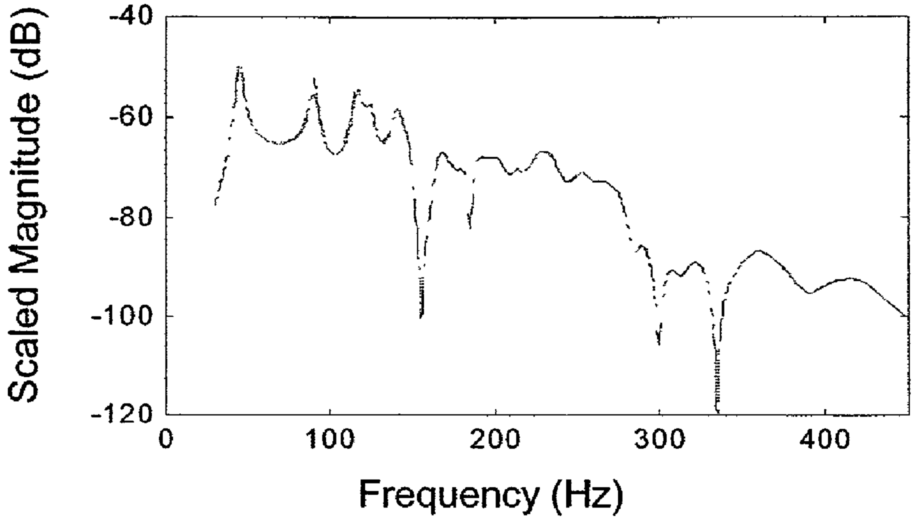
FIG. 7(*a*) is a plot of the acoustic frequency response function of an uncontrolled (dashed line) and controlled (solid line) rectangular enclosure at 20-450 Hz according to the present invention.
Figure 7B:
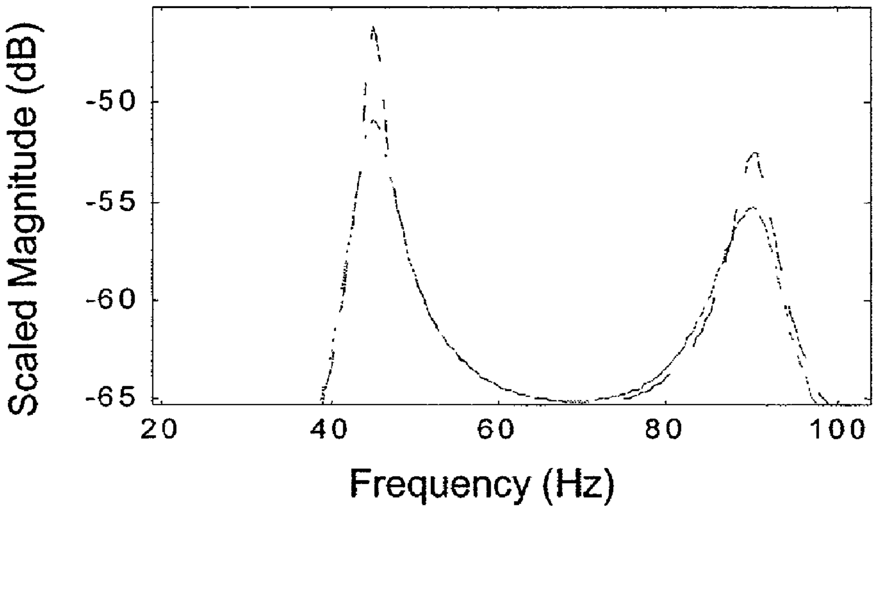

In a simulation study, two acoustic damping controllers, cascaded in parallel, were tuned to the first two acoustic modes of the 3.8×1.5×1.2 m rectangular enclosure discussed above. Using the model of the enclosure, the effectiveness of these acoustic damping controllers was evaluated at ten different points within the enclosure. FIGS. 7(*a*) and 7(*b*) show the uncontrolled and controlled frequency response function of the cavity at one of these locations. Although damping is a geometry independent parameter, the frequency response functions at other locations were closely examined to assure that active damping at one location is not achieved at the expense of deteriorating damping at other locations. The acoustic wave actuator was located at the rear right corner of the enclosure with the acoustic wave sensor nearly collocated with it.

Figure 8:
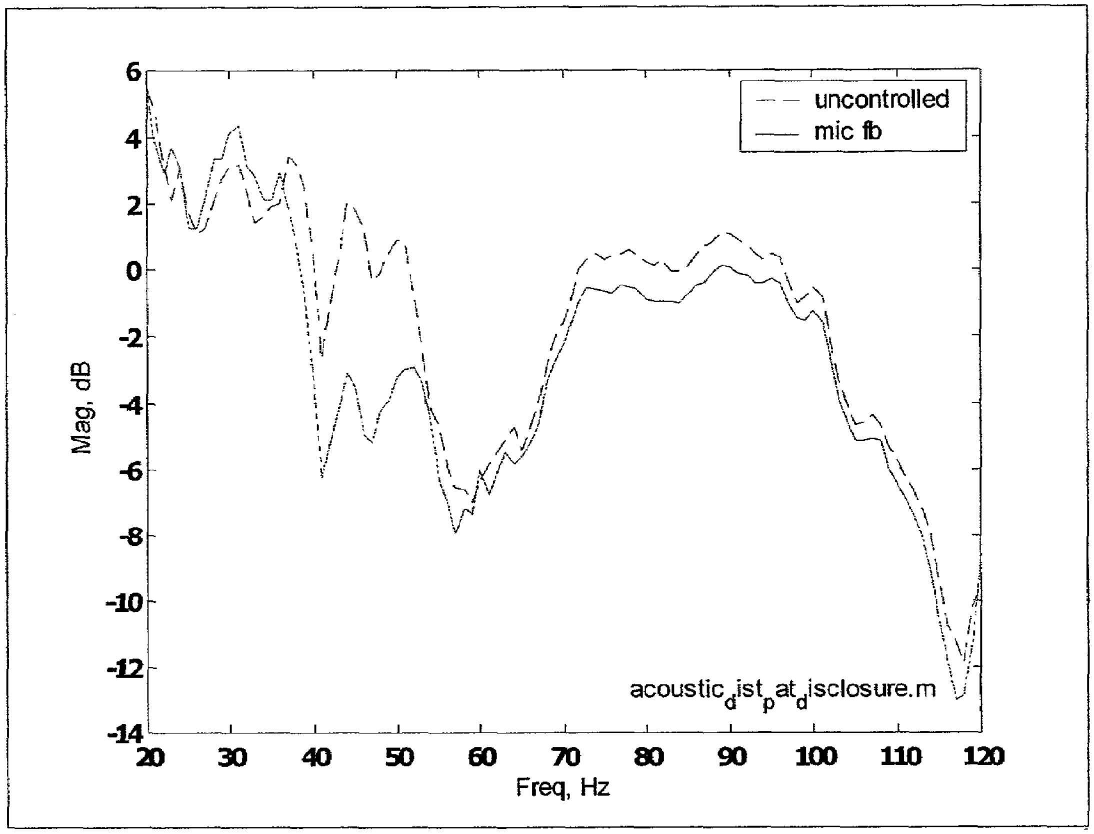
FIG. 8 is a plot of the frequency response functions mapping the voltage driving the disturbance speaker to the scaled pressure at the driver's ear without (dashed line) and with (solid line) the acoustic damping controller of the present invention.
Figure 9:
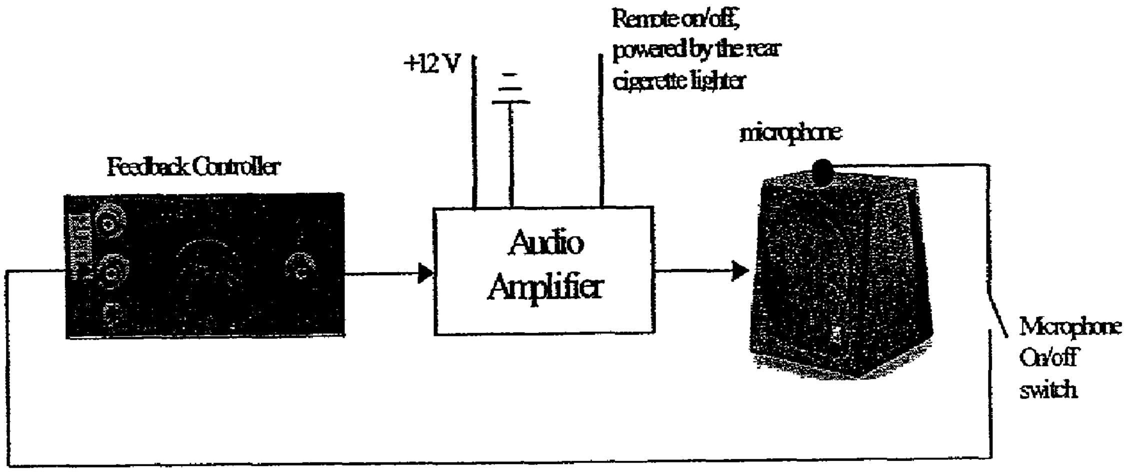
FIG. 9 is a general block diagram of the first electronic feedback loop system according to the present invention.

The system of the present invention for actively damping cavity induced low-frequency boom noise within an enclosure was tested by installing a speaker and a low-cost microphone, as the acoustic wave actuator and sensor, and an op-amp circuit controller (the acoustic damping controller) in a sport utility vehicle. The acoustic damping controller, which was tuned to the first cavity induced acoustic mode of the vehicle cavity, added a significant amount of damping to that mode (around 45 Hz); see FIG. 8 depicting the frequency response function mapping the voltage driving the acoustic wave actuator to the pressure measured (by the acoustic wave sensor) at the driver's ear location. A block diagram of this feedback control system is shown in FIG. 9.

The acoustic damping controller could have been tuned to other standing waves or even more than one standing wave and received equally effective results. Experimental and simulation results both indicate the effectiveness of this controller in adding damping to the selective, low-frequency acoustic modes.

In addition to the cavity originated resonance, a vehicle or other like enclosure (depending on its design) could exhibit adjacent acoustic peak frequencies originated from the roof structural vibration. An enhancement to the above acoustic damping strategy has been developed to add damping to the first acoustic mode originated from roof vibration. Depending on the application, this enhancement can either work in conjunction with the first electronic feedback loop, sharing the same acoustic wave actuator, or it can be a stand-alone, active feedback control scheme.

Also illustrated in FIG. 1, the second electronic feedback loop defines a vibro-acoustic controller 32. The viboracoustic controller 32 can define a second electronic feedback loop input 33 coupled to the motion sensor signal 31 and a second electronic feedback loop output 34. The second electronic feedback loop can be configured to generate a second electronic feedback loop output signal by applying a feedback loop transfer function to the motion sensor signal 31.

Figure 10:
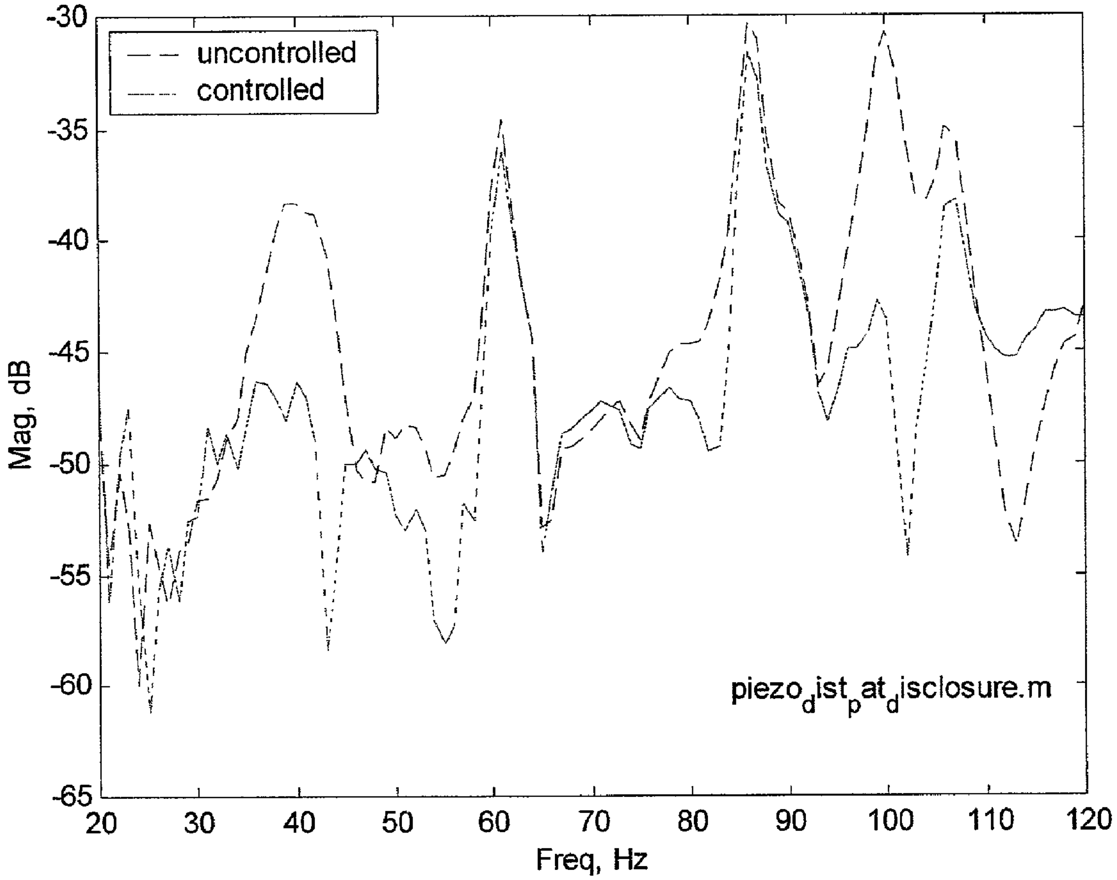
FIG. 10 is a plot of the frequency response functions mapping the voltage driving the piezo shaker to the scaled pressure at the driver's ear without (dashed line) and with (solid line) the vibro-acoustic controller of the present invention.

To demonstrate the effectiveness of the vibro-acoustic control system using the single motion sensor 30, the roof of a cabin of a sport utility vehicle was shaken using a piezo shaker while the pressure near the driver's ear was measured. The frequency response functions mapping the voltage driving the piezo shaker to the measured pressure, with and without active feedback control, were evaluated and the scaled magnitude is illustrated in FIG. 10. The vibro-acoustic controller, which was tuned to the first roof induced vibro-acoustic mode, effectively damps that mode (around 40 Hz).

The low-frequency of the vibro-acoustic mode targeted for damping allows for an even more simplified vibro-acoustic controller. When the tuned natural frequency is well below the corner frequency of the acoustic wave actuator (e.g., 70 Hz for a Polk Audio 8 inch dX Series speaker in a small box), then the phase angle added to the system by the acoustic wave actuator is predictable (about 180 degrees). Consequently, it is also possible to compensate for the dynamics of the acoustic wave actuator by accounting for the fact that the speaker adds a phase lead of about 180 degrees at low frequencies. As such, a phase lag of 180 degrees can be added to the vibro-acoustic controller by applying the following feedback loop transfer function:

$$\frac{V(s)}{P(s)} = C\frac{\omega_n^2}{s^2 + 2\zeta\omega_n s + \omega_n^2} \tag{4}$$

where the units of V(s) corresponds to the rate of change of volume velocity, P(s) corresponds to the pressure at the location of the acoustic wave actuator 40 and the acoustic wave sensor 20, s is the Laplace variable, $\zeta$ is a damping ratio, $\omega_n$ is the tuned natural frequency, and C is a constant representing a power amplification factor and a gain value. The feedback loop transfer function of equation (4) will not be augmented by the inverse of the speaker transfer function.

As further illustrated in FIG. 5, the second electronic feedback loop can further define a middle panel vibro-acoustic controller 32*a* in parallel with a rear panel vibro-acoustic controller 32*b*. The middle panel vibro-acoustic controller 32*a* can define a middle panel vibro-acoustic controller input 33*a* coupled to the middle panel motion sensor signal 31*a* and a middle panel vibro-acoustic controller output 34*a*. The middle panel vibro-acoustic controller can be further configured to generate a middle panel vibro-acoustic controller output signal by applying a feedback loop transfer function to the middle panel motion sensor signal 31*a*. The rear panel vibro-acoustic controller 32*b* can define a rear panel vibro-acoustic controller input 33*b* coupled to the rear panel motion sensor signal 31*b* and a rear panel vibro-acoustic controller output 34*b*. The rear panel vibro-acoustic controller 32*b* can be further configured to generate a rear panel vibro-acoustic controller output signal by applying an electronic feedback loop transfer function to the rear panel motion sensor signal 31*b*.

Figure 11:
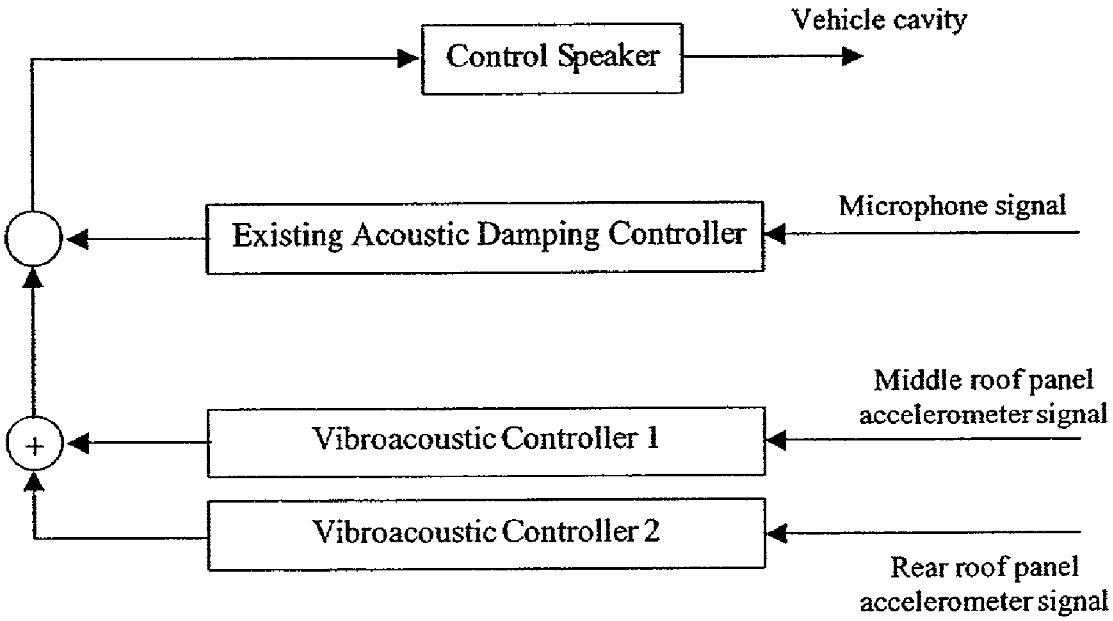
FIG. 11 is a general block diagram illustrating the first and second electronic feedback loop systems according to the present invention.

The middle panel vibro-acoustic controller output signal and the rear panel vibro-acoustic controller output signal can be combined to generate a second electronic feedback loop output signal 35 (see FIG. 5), which can be an electric signal. The acoustic wave actuator 40 substantially collocated with the acoustic wave sensor 20 is responsive to both the first electronic feedback loop output signal 25 and the second electronic feedback loop output signal 35, which are both representative of a rate of change of volume velocity to be produced by the acoustic wave actuator 40. The acoustic wave actuator 40 can introduce characteristic acoustic dynamics into the system 10 in response to the first and second electronic feedback loops. FIG. 11 shows a block diagram of this control strategy.

Figures 12A, 12B, 12C:
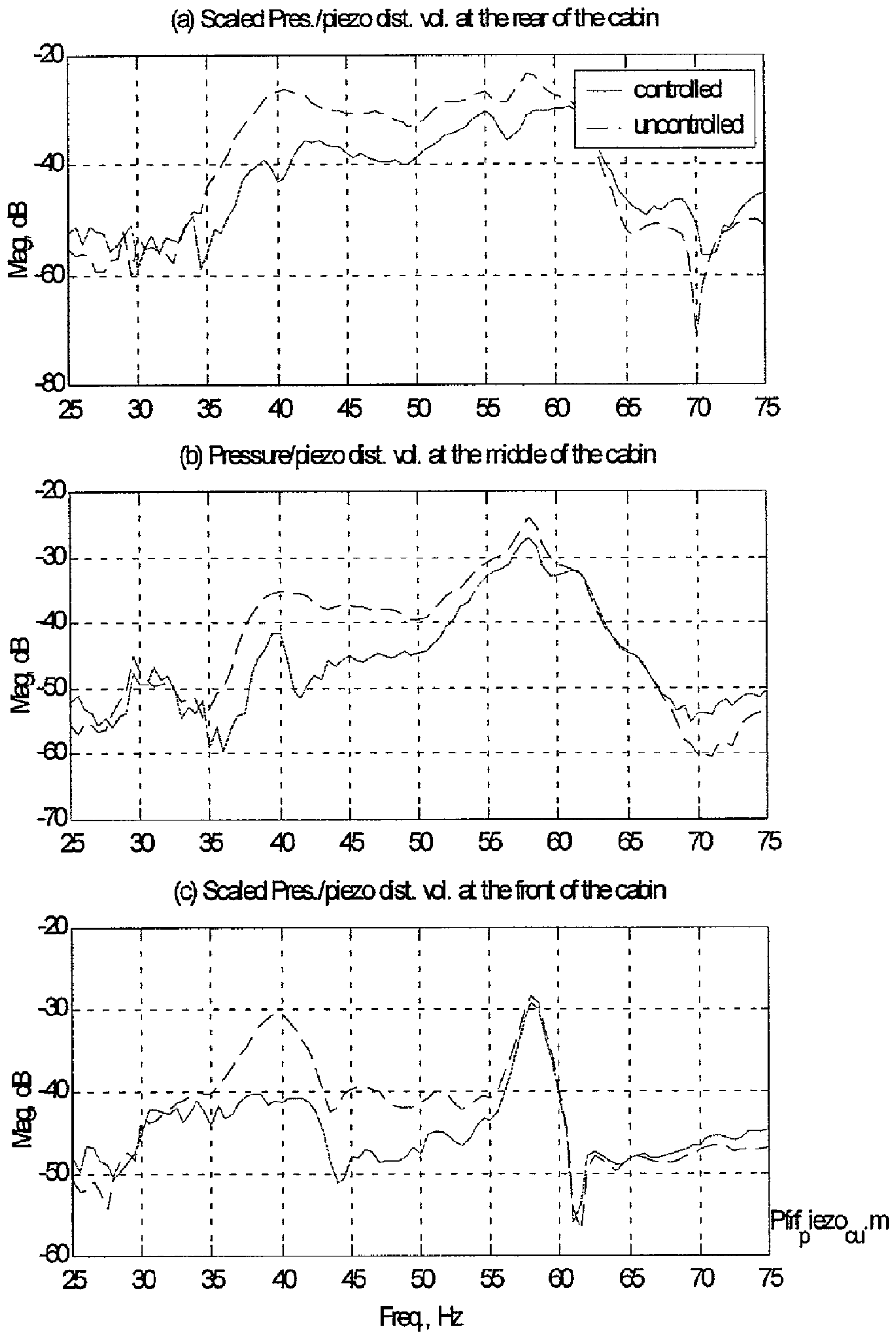
FIG. 12(*a*) is a plot of the frequency response functions mapping the voltage driving the piezo shaker to the scaled pressure measured at the rear seats of a sport utility vehicle for the controlled and uncontrolled system according to the present invention.
Figure 13:
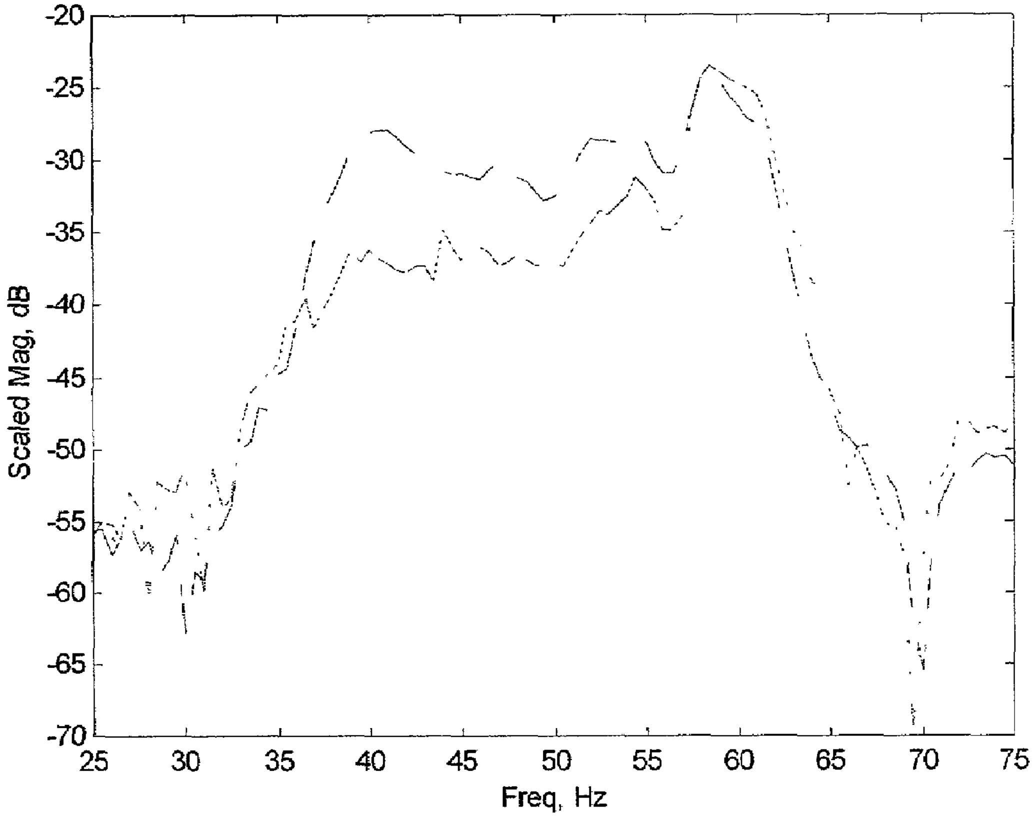
FIG. 13 is a plot of the frequency response functions mapping the voltage driving the piezo shaker to the scaled pressure at the driver's ear without (dashed line) and with (solid line) the vibro-acoustic controller of the present invention.

In a laboratory evaluation, two pieces of large piezoelectric strain actuators were mounted on a high strain area of the roof of a sport utility vehicle and were driven as a unit to excite the vibro-acoustic system by vibrating the roof. The frequency response function mapping the voltage driving the piezo shakers to the pressure at the driver's ear was measured. FIGS. 12(*a*)-12(*c*) and 13 depict these frequency response functions which clearly show the effectiveness of the controller performing the job it was designed for, i.e., adding damping to the first roof induced vibro-acoustic mode (around 40 Hz). This control solution was also evaluated, subjectively, achieving high scores. The reasonable cost of this control strategy along with its high effectiveness makes it a very viable boom noise controller.

In addition, it has also been observed that the idle engine firing frequency (engine rpm multiplied by the number of firings in the cylinders per revolution) of most large vehicles is particularly close to the structural vibration resonance that cause structural vibration induced low-frequency acoustic modes in such vehicles. Consequently, the system of the present invention is also effective in adding damping to low-frequency acoustic modes excited by idle engine firings.

Figure 14:
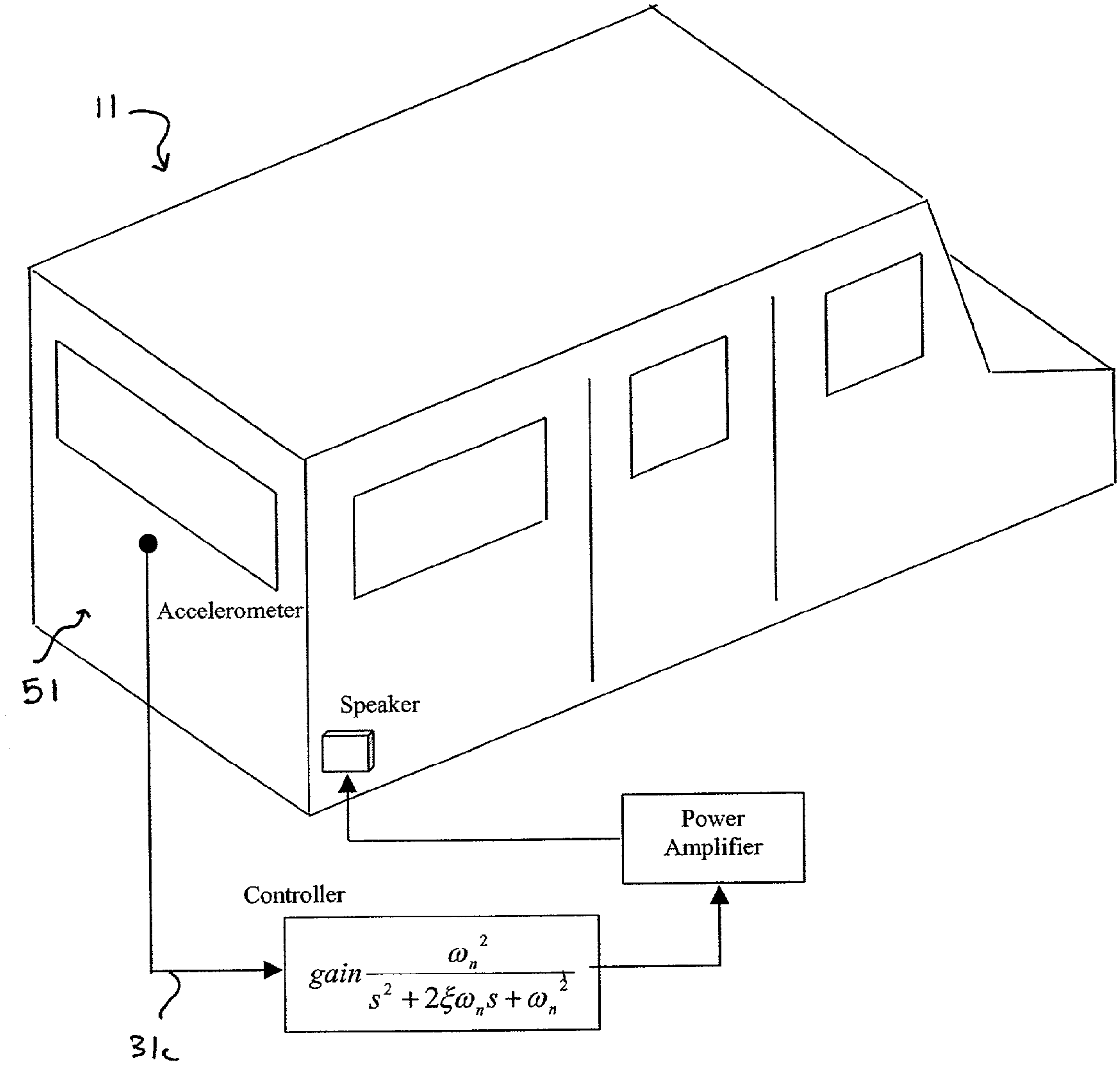
FIG. 14 is a schematic illustration of a system for actively damping boom noise according to another embodiment of the present invention.

In still another embodiment of the present invention illustrated in FIG. 14, the enclosure 11 further defines a tailgate panel 51. The structural dynamics of the tailgate panel 51 add a very low-frequency vibro-acoustic mode to the enclosure 11 (i.e., the cabin of a large automobile such as a sport utility vehicle). This tailgate vibration induced low-frequency acoustic mode has a resonant frequency (about 30 Hz) that is substantially different than the resonant frequencies of the roof structural vibration induced acoustic mode (about 40 Hz) and the first cavity induced low-frequency acoustic mode (about 45 Hz). By substantially different we mean a difference in resonant frequency of around 10 Hz. Consequently, in order to add damping to the roof structural vibration induced low-frequency acoustic mode both a motion sensor and an acoustic wave actuator is utilized given the relatively close resonant frequencies of the roof structural vibration induced low-frequency acoustic mode and the first cavity induced low-frequency acoustic mode (a difference of about 5 Hz). However, given that the resonant frequency of the tailgate vibration induced low-frequency acoustic mode is substantially different than the first cavity induced resonant frequency (a difference of about 15 Hz) a single sensor and controller can be used to add damping to this mode.

Accordingly, a system for actively damping boom noise is provided comprising an enclosure 11 defining a tailgate panel 51, at least one tailgate vibration induced low-frequency acoustic mode, a sensor, an acoustic wave actuator, and a single electronic feedback loop. The sensor can be selected from an acoustic wave sensor, a motion sensor 30 secured to the tailgate panel 51, and a combination thereof. If the sensor is an acoustic wave sensor, it will be substantially collocated with the acoustic wave actuator. The electronic feedback loop can be selected from a first electronic feedback loop defining an acoustic damping controller, a second electronic feedback loop defining a vibro-acoustic controller, and a combination thereof.

The motion sensor 30 can be an accelerometer (i.e., low-cost MEMS accelerometers similar to those used in air bag systems) and can be configured to produce a tailgate motion sensor signal 31*c* that is representative of the at least one tailgate vibration induced low-frequency acoustic mode. The tailgate motion sensor signal 31*c* can be an electric signal indicative of measured acceleration detected by the motion sensor 30 as a result of structural vibration of the tailgate panel 51 and can be representative of a single or a plurality of tailgate vibration induced low-frequency acoustic modes.

The acoustic wave sensor can be a microphone that can be positioned within the enclosure 11. The acoustic wave sensor can be configured to produce an acoustic wave sensor signal representative of the at least one tailgate induced low-frequency acoustic mode. This acoustic wave sensor signal can comprise an electric signal indicative of measured acoustic resonance detected by the acoustic wave sensor within the enclosure 11 and can be representative of a single or a plurality of structural vibration induced low-frequency acoustic modes.

The acoustic damping controller can define a first electronic feedback loop input coupled to an acoustic wave sensor signal and a first electronic feedback loop output, wherein the first electronic feedback loop is configured to generate a first electronic feedback loop output signal by applying a feedback loop transfer function to the acoustic wave sensor signal. In addition, the vibro-acoustic controller can define a second electronic feedback loop input coupled to a motion sensor signal 31*c* and a second electronic feedback loop output, wherein the second electronic feedback loop is configured to generate a second electronic feedback loop output signal by applying a feedback loop transfer function to the motion sensor signal 31*c*.

The influence of the tailgate panel 51 of a sport utility vehicle on the vibro-acoustics of the vehicle cabin was studied. The tuning frequency was much smaller than the corner frequency of the speaker or acoustic wave actuator. Accordingly, the feedback loop transfer function of equation (4) with two poles and no zeros was used for active damping. The sign of the feedback will depend on whether the motion sensor 30 is secured inside or outside of the vehicle cabin. Using the controller of equation (4), the same mode was also damped by feeding back acoustic pressure measured by an acoustic wave sensor and a collocated acoustic wave actuator, either in conjunction with or in place of measured acceleration feedback.

Figure 15:
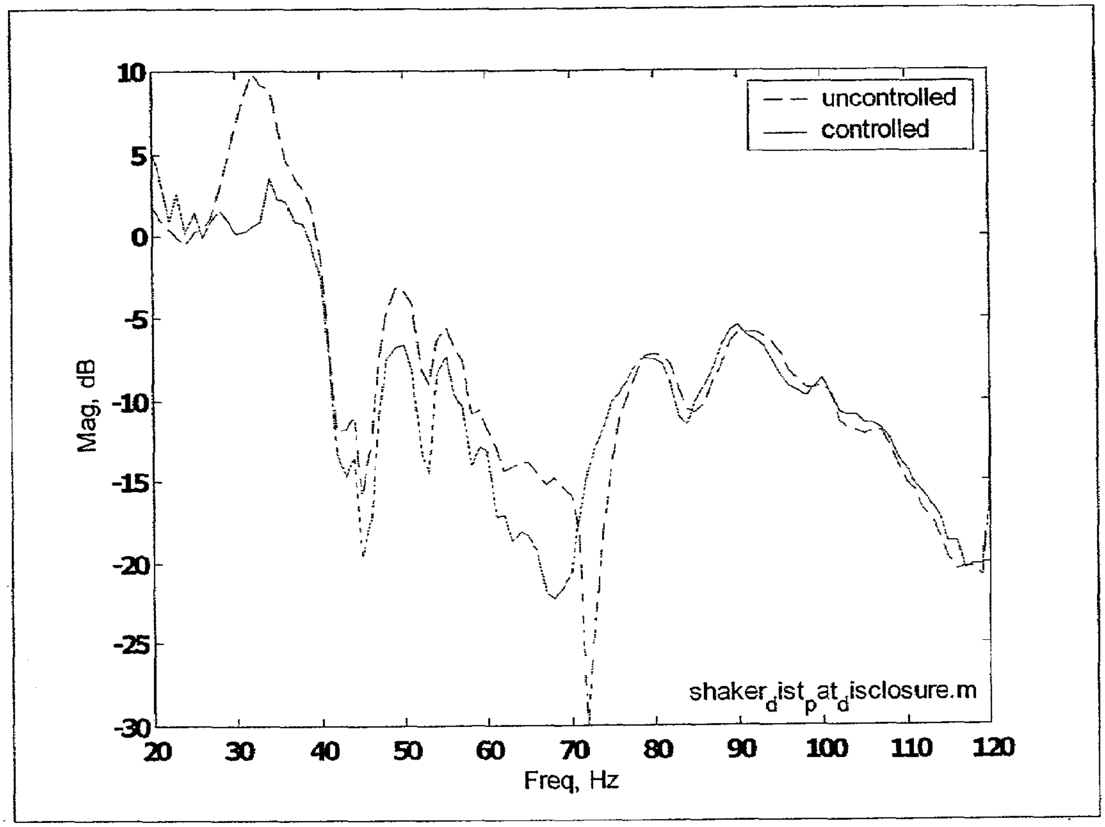
FIG. 15 is a plot of the frequency response functions mapping the voltage driving the electromagnetic shaker to the scaled pressure at the driver's ear without (dashed line) and with (solid line) the vibro-acoustic controller of the present invention.

The effectiveness of this control scheme was evaluated by shaking the tailgate panel 51 using an electromagnetic shaker while the acoustic pressure near the driver's ear was measured. The frequency response functions mapping the voltage driving the electromagnetic shaker to the acoustic pressure measured, both with and without control, were evaluated and their scaled magnitude is depicted in FIG. 15. The vibro-acoustic controller, with only a denominator, was tuned to the 30 Hz mode. As illustrated in FIG. 15, the active feedback control system added an appreciable amount of damping to the targeted mode.

Accordingly, low-frequency boom noise within an enclosure is significantly damped, according to the present invention, by securing the motion sensor 30 to a panel of the enclosure 11, positioning the acoustic wave sensor 20 within the enclosure 11, positioning the acoustic wave actuator 40 within the enclosure 11, substantially collocating the acoustic wave sensor 20 with the acoustic wave actuator 40, and coupling the first and second electronic feedback loop inputs 23, 33 of the first and second electronic feedback loops to the acoustic wave sensor signal 21. The first and second electronic feedback loops are configured to generate the respective first and second electronic feedback loop output signals, which are coupled to the acoustic wave actuator 40, by applying a feedback loop transfer function to the acoustic wave sensor signal 21 and motion sensor signal 31. The feedback loop transfer function can comprise a second order differential equation including the first variable $\zeta$ representing a predetermined damping ratio and the second variable $\omega_n$ representing a tuned natural frequency. Values for the first variable $\zeta$ and the second variable $\omega_n$ are selected to optimize damping of at least one of the plurality of low-frequency modes.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A system for actively damping boom noise comprising:

an enclosure defining a plurality of low-frequency acoustic modes;

an acoustic wave sensor positioned within said enclosure, wherein said acoustic wave sensor is configured to produce an acoustic wave sensor signal representative of at least one of said plurality of low-frequency acoustic modes;

a motion sensor secured to a panel of said enclosure, wherein said motion sensor is configured to produce a motion sensor signal representative of at least one of said plurality of low-frequency acoustic modes;

an acoustic wave actuator substantially collocated with said acoustic wave sensor and positioned within said enclosure, wherein said acoustic wave actuator is responsive to a first electronic feedback loop output signal and a second electronic feedback loop output signal;

a first electronic feedback loop defining an acoustic damping controller, wherein said acoustic damping controller defines a first electronic feedback loop input coupled to said acoustic wave sensor signal and a first electronic feedback loop output, wherein said first electronic feedback loop is configured to generate said first electronic feedback loop output signal by applying a feedback loop transfer function to said acoustic wave sensor signal, wherein said feedback loop transfer function comprises a second order differential equation including a first variable representing a predetermined damping ratio and a second variable representing a tuned natural frequency, said second variable representing said tuned natural frequency is selected to be tuned to a natural frequency of at least one of said plurality of low-frequency acoustic modes, said feedback loop transfer function defines a frequency response having a characteristic maximum gain substantially corresponding to the value of said tuned natural frequency, wherein said feedback loop transfer function creates a 90 degree phase lead substantially at said tuned natural frequency; and a second electronic feedback loop defining a vibro-acoustic controller, wherein said vibro-acoustic controller defines a second electronic feedback loop input coupled to said motion sensor signal and a second electronic feedback loop output, and wherein said second electronic feedback loop is configured to generate said second electronic feedback loop output signal by applying said feedback loop transfer function to said motion sensor signal.

2. A system for actively damping boom noise as claimed in claim 1 wherein said motion sensor signal comprises an electric signal indicative of measured acceleration detected by said motion sensor as a result of structural vibration of said panel, said acoustic wave sensor signal comprises an electric signal indicative of measured resonance detected by said acoustic wave sensor within said enclosure, and said first and second electronic feedback loop output signals are representative of a rate of change of volume velocity to be produced by said acoustic wave actuator.

3. A system for actively damping boom noise as claimed in claim 1 wherein said motion sensor signal comprises an electric signal indicative of measured acceleration detected by said motion sensor as a result of structural vibration of said panel, said acoustic wave sensor signal comprises an electric signal indicative of measured resonance detected by said acoustic wave sensor within said enclosure, and said first and second electronic feedback loop output signals are representative of a rate of change of volume velocity to be produced by said acoustic wave actuator, and wherein said feedback loop transfer function is as follows:

$$\frac{V(s)}{P(s)} = C\frac{s^2}{s^2 + 2\zeta\omega_n s + \omega_n^2} \quad (1)$$

where the units of V(s) corresponds to said rate of change of volume velocity, P(s) corresponds to the pressure at the location of said acoustic wave actuator and said acoustic wave sensor, s is a Laplace variable, $\zeta$ is a damping ratio, $\omega_n$ is said tuned natural frequency, and C is a constant representing at least one of a power amplification factor and a gain value.

4. A system for actively damping boom noise as claimed in claim 1 wherein said motion sensor signal comprises an electric signal indicative of measured acceleration detected by said motion sensor as a result of structural vibration of said panel, said acoustic wave sensor signal comprises an electric signal indicative of measured resonance detected by said acoustic wave sensor within said enclosure, and said first and second electronic feedback loop output signals are representative of a rate of change of volume velocity to be produced by said acoustic wave actuator, and wherein said feedback loop transfer function is as follows:

$$\frac{V(s)}{P(s)} = -C\frac{\omega_n^2}{s^2 + 2\zeta\omega_n s + \omega_n^2} \quad (2)$$

where the units of V(s) corresponds to said rate of change of volume velocity, P(s) corresponds to the pressure at the location of said acoustic wave actuator and said acoustic wave sensor, s is a Laplace variable, $\zeta$ is a damping ratio, ωhd n is said tuned natural frequency, and C is a constant representing at least one of a power amplification factor and a gain value.

5. A system for actively damping boom noise as claimed in claim 1 wherein said motion sensor signal comprises an electric signal indicative of measured acceleration detected by said motion sensor as a result of structural vibration of said panel, said acoustic wave sensor signal comprises an electric signal indicative of measured resonance detected by said acoustic wave sensor within said enclosure, and said first and second electronic feedback loop output signals are representative of a rate of change of volume velocity to be produced by said acoustic wave actuator, and wherein said feedback loop transfer function is as follows:

$$\frac{V(s)}{P(s)} = C\frac{s^2 + 2\zeta_s\omega_{ns}s + \omega_{ns}^2}{s^2 + 2\zeta\omega_n s + \omega_n^2} \quad (3)$$

where the units of V(s) corresponds to said rate of change of volume velocity, P(s) corresponds to the pressure at the location of said acoustic wave actuator and said acoustic wave sensor, s is a Laplace variable, $\zeta$ is a damping ratio of the controller, $\zeta_s$ is a damping ratio of the acoustic wave actuator, $\omega_n$ is a tuned natural frequency, and $\omega_{ns}$ is a natural frequency of the acoustic wave actuator, and C is a constant representing at least one of a power amplification factor and a gain value.

6. A system for actively damping boom noise as claimed in claim 1 wherein said motion sensor signal comprises an electric signal indicative of measured acceleration detected by said motion sensor as a result of structural vibration of said panel, said acoustic wave sensor signal comprises an electric signal indicative of measured resonance detected by said acoustic wave sensor within said enclosure, and said first and second electronic feedback loop output signals are representative of a rate of change of volume velocity to be produced by said acoustic wave actuator, and wherein said feedback loop transfer function is as follows:

$$\frac{V(s)}{P(s)} = C\frac{\omega_n^2}{s^2 + 2\zeta\omega_n s + \omega_n^2} \quad (4)$$

where the units of V(s) corresponds to said rate of change of volume velocity, P(s) corresponds to the pressure at the location of said acoustic wave actuator and said acoustic wave sensor, s is a Laplace variable, $\zeta$ is a damping ratio, $\omega_n$ is said tuned natural frequency, and C is a constant representing at least one of a power amplification factor and a gain value.

7. A method for actively damping boom noise within an enclosure defining a plurality of low-frequency acoustic modes comprising the steps of:

securing a motion sensor to a panel of said enclosure, wherein said motion sensor is configured to produce a motion sensor signal representative of at least one of said plurality of low-frequency acoustic modes;

positioning an acoustic wave sensor within said enclosure, wherein said acoustic wave sensor is configured to produce an acoustic wave sensor signal representative of at least one of said plurality of low-frequency acoustic modes;

positioning an acoustic wave actuator responsive to a first electronic feedback loop output signal and a second electronic feedback loop output signal within said enclosure, wherein said acoustic wave actuator is substantially collocated with said acoustic wave sensor;

coupling a first electronic feedback loop input of a first electronic feedback loop to said acoustic wave sensor signal and a first electronic feedback loop output, wherein said first electronic feedback loop is configured to generate said first electronic feedback loop output signal by applying a feedback loop transfer function to said acoustic wave sensor signal;

coupling a second electronic feedback loop input of a second electronic feedback loop to said motion sensor signal and a second electronic feedback loop output, wherein said second electronic feedback loop is configured to generate said second electronic feedback loop output signal by applying a feedback loop transfer function to said motion sensor signal; and operating said acoustic wave actuator in response to said first and second electronic feedback loop output signals.

8. A method for actively damping boom noise within an enclosure defining a plurality of low-frequency acoustic modes comprising the steps of:

securing a motion sensor to a panel of said enclosure, wherein said motion sensor is configured to produce a motion sensor signal representative of at least one of said plurality of low-frequency acoustic modes;

positioning an acoustic wave sensor within said enclosure, wherein said acoustic wave sensor is configured to produce an acoustic wave sensor signal representative of at least one of said plurality of low-frequency acoustic modes;

positioning an acoustic wave actuator responsive to a first electronic feedback loop output signal and a second electronic feedback loop output signal within said enclosure, wherein said acoustic wave actuator is substantially collocated with said acoustic wave sensor;

coupling a first electronic feedback loop input of a first electronic feedback loop to said acoustic wave sensor signal and a first electronic feedback loop output, wherein said first electronic feedback loop is configured to generate said first electronic feedback loop output signal by applying a feedback loop transfer function to said acoustic wave sensor signal, wherein said feedback loop transfer function comprises a second order differential equation including a first variable representing a predetermined damping ratio and a second variable representing a tuned natural frequency, said second variable representing said tuned natural frequency is selected to be tuned to a natural frequency of at least one of said plurality of low-frequency acoustic modes, said feedback loop transfer function defines a frequency response having a characteristic maximum gain substantially corresponding to the value of said tuned natural frequency, and wherein said feedback loop transfer function creates a 90 degree phase lead substantially at said tuned natural frequency;

coupling a second electronic feedback loop input of a second electronic feedback loop to said motion sensor signal and a second electronic feedback loop output, wherein said second electronic feedback loop is configured to generate said second electronic feedback loop output signal by applying said feedback loop transfer function to said motion sensor signal;

selecting a value for said first variable representing said predetermined damping ratio;

selecting a value for said second variable representing said tuned natural frequency; and operating said acoustic wave actuator in response to said first and second electronic feedback loop output signals.

* * * * *

UNITED STATES PATENT AND TRADEMARK OFFICE

CERTIFICATE OF CORRECTION

PATENT NO. : 7,305,094 B2
APPLICATION NO. : 10/044045
DATED : December 4, 2007
INVENTOR(S) : Reza Kashani It is certified that error appears in the above-identified patent and that said Letters Patent is hereby corrected as shown below:

Col. 17, Claim 4, line 54 "ratio, whd n is said" should read as -- ratio, $\omega_n$ is said --

Signed and Sealed this

Twenty-second Day of July, 2008

JON W. DUDAS
*Director of the United States Patent and Trademark Office*